United States Patent
Ishihara et al.

(10) Patent No.: US 7,057,657 B1
(45) Date of Patent: Jun. 6, 2006

(54) SOLID-STATE IMAGE PICKUP APPARATUS CAPABLE OF READING OUT IMAGE SIGNALS WHILE THINNING THEM DOWN HORIZONTALLY AND SIGNAL READING METHOD THEREFOR

(75) Inventors: Atsuhiko Ishihara, Asaka (JP); Tomohiro Sakamoto, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/431,875

(22) Filed: Nov. 2, 1999

(30) Foreign Application Priority Data

Nov. 6, 1998 (JP) ................................. 10-315510

(51) Int. Cl.
H04N 5/335 (2006.01)

(52) U.S. Cl. ................... 348/312; 348/322; 348/220.1

(58) Field of Classification Search ................ 348/312, 348/311, 315, 317, 319, 322, 324, 362, 272, 348/273, 279, 294, 350, 220.1, 222.1, 229.1, 348/333.01, 333.09, 333.11; 250/208.1
See application file for complete search history.

(56) References Cited

U.S. PATENT DOCUMENTS

| | | | | |
|---|---|---|---|---|
| 4,541,010 A | * | 9/1985 | Alston | 348/333.01 |
| 4,876,590 A | * | 10/1989 | Parulski | 348/333.11 |
| 4,924,316 A | * | 5/1990 | Kobayashi et al. | 348/222.1 |
| 5,264,939 A | * | 11/1993 | Chang | 348/322 |
| 5,563,658 A | * | 10/1996 | Parulski et al. | 348/350 |
| 5,828,406 A | * | 10/1998 | Parulski et al. | 348/220.1 |
| 5,926,215 A | * | 7/1999 | Whipple et al. | 348/322 |
| 6,147,707 A | * | 11/2000 | Terasawa et al. | 348/229.1 |
| 6,236,434 B1 | * | 5/2001 | Yamada | 348/315 |
| 6,426,493 B1 | | 7/2002 | Oda | |
| 6,452,632 B1 | * | 9/2002 | Umeda et al. | 348/294 |
| 6,522,356 B1 | * | 2/2003 | Watanabe | 348/272 |
| 6,757,015 B1 | * | 6/2004 | Inokuma et al. | 348/272 |
| 2001/0024237 A1 | * | 9/2001 | Osada et al. | 348/312 |
| 2002/0057349 A1 | * | 5/2002 | Yamaguchi et al. | 348/222.1 |

FOREIGN PATENT DOCUMENTS

JP        A10136244         5/1998

* cited by examiner

*Primary Examiner*—Aung Moe
(74) *Attorney, Agent, or Firm*—Birch, Stewart, Kolasch & Birch, LLP

(57) ABSTRACT

In a solid-state image pickup apparatus, an image pickup section includes a color separating section having color filters assigned to three primary colors for separating colors of light incident from a desired scene. The color filters assigned to the color G are arranged in stripes. A system controller controls an output of a drive signal generating section for each of an all pixel read mode and a photometry control mode in response to the stroke of a shutter release operation. In the photometry control mode, the image pickup device is supplied with drive signals in response to a horizontal timing signal fed from a timing signal generator and a control signal fed from the system controller. The image pickup device thus reads out only the signal charges representative of the color G in this mode, thereby especially implementing the signal charge reading at a doubled speed.

20 Claims, 6 Drawing Sheets

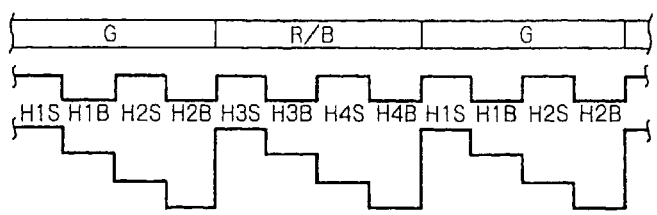
Fig. 5A  COLORS & DRIVE SIGNAL
H1
Fig. 5B  ALL PIXEL READ DRIVE SIGNAL
Fig. 5C  ALL PIXEL READ DRIVE SIGNAL (ANOTHER PATTERN)
Fig. 5D  H1S
Fig. 5E  H2B
Fig. 5F  H3S
Fig. 5G  H4B
Fig. 5H  G SELECTION DRIVE SIGNAL
Fig. 5I  G SELECTION DRIVE SIGNAL

SOLID-STATE IMAGE PICKUP APPARATUS CAPABLE OF READING OUT IMAGE SIGNALS WHILE THINNING THEM DOWN HORIZONTALLY AND SIGNAL READING METHOD THEREFOR

BACKGROUND OF THE INVENTION

1. Field of the Invention

The present invention relates to a solid-state image pickup apparatus capable of reading out images signals while thinning them down in the horizontal direction, and a signal reading method therefor. More particularly, the present invention relates to a solid-state image pickup apparatus capable of processing image signals representative of, e.g., a scene picked up and outputting the processed image signals while using the image signals for a control purpose. The present invention is desirably applicable to, e.g., a digital still camera, image input apparatus or similar imaging apparatus of the type automatically adjusting a focus and an exposure with image signals representative of a scene picked up.

2. Description of the Background Art

An imaging apparatus of the type described includes an image pickup section having CCDs (Charge Coupled Devices) or similar photosensitive devices each forming a single pixel or cell. Today, the number of pixels required of the image pickup section is increasing to meet the increasing demand for higher image quality. This, however, increases a period of time necessary for image signals to be read out of the image pickup section.

Japanese patent laid-open publication No. 136244/1998, for example, teaches an electronic image pickup apparatus capable of reducing the above period of time for driving an image pickup section. The image pickup apparatus taught in this document implements the display of a movie with a drive frequency of less than 20 MHz despite that it uses an image sensor having about 1,000,000 CCDs. Specifically, the apparatus uses color filters arranged in a Bayer pattern in combination with the CCD image sensor. In a high speed mode, the apparatus drives the image pickup section in such a manner as to output one line of image signals every three lines, i.e., to thin down the lines in the vertical direction. This is successful to read image signals at a high speed with a low drive frequency. Particularly, when automatic focus (AF) adjustment, automatic white balance (AWB) adjustment and automatic exposure (AE) adjustment are effected during movie display, control data is required frame by frame. In this case, the apparatus selects a mode for adding three consecutive lines of signals and outputting the resulting sum. In this manner, to reduce the signal reading time, the apparatus thins down the lines in the vertical direction. For the AF, AWB and AE adjustment, the apparatus adds up three consecutive lines of signal charges in order to produce a control signal, i.e., reads all of the three primary colors R (red), G (green) and B (blue) separated by the color filters and then combines them.

As for the generation of control data for AE and AF, a luminance signal plays an important role, as well known in the art. In addition, in a solid-state image pickup apparatus, only the color G contributes to the generation of a luminance signal, as also generally accepted. For photometry, therefore, only the color G may be read out in order to promote effective signal reading. However, it is difficult with the Bayer arrangement to read only the color G because the colors R, G and B exist together in an array.

SUMMARY OF THE INVENTION

It is therefore an object of the present invention to provide a solid-state image pickup apparatus capable of reading only the color G and eventually reducing a period of time necessary for signal charges to be transferred in the horizontal direction, and a signal reading method therefor.

A solid-state image pickup apparatus of the present invention includes an image pickup section. The image pickup section includes a color separating section having color filters assigned to three primary colors R, G and B for separating colors of light incident from a desired scene. The color filters assigned to the color G are arranged in stripes. A plurality of photosensitive cells are arranged bidimensionally in one-to-one correspondence to the color filters each for transforming light output from a particular color filter to a corresponding signal charge. A plurality of vertical transfer paths each have transfer elements vertically arranged for vertically transferring signal charges fed from the adjoining photosensitive cells. A horizontal transfer path perpendicular to the vertical transfer paths has transfer elements horizontally arranged for transferring the signal charges fed from the vertical transfer paths. Signal reading circuitry shifts the signal charges from the photosensitive cells to the vertical transfer paths. Charge sweeping circuitry sweeps out needless ones of the signal charges stored in the photosensitive cells. A mode selecting section selects, when the operation for reading the signal charges out of the image pickup section is represented by a mode, either one of an all pixel read mode for reading the signal charges from all of the photosensitive devices and a particular pixel read mode for reading only the signal charges representative of the color G. A drive signal generating section feeds horizontal and vertical drive signals to the image pickup section, and provides the horizontal drive signals with a period shorter in the particular pixel read mode than in the all pixel read mode. A controller controls the drive signal generating section in a particular manner in each of the all pixel read mode and particular pixel read mode.

BRIEF DESCRIPTION OF THE DRAWINGS

The objects and features of the present invention will become more apparent from the consideration of the following detailed description taken in conjunction with the accompanying drawings in which:

FIGS. 5A–5I are timing charts representative of a specific relation between drive signals fed from the H driver of FIG. 3 in a still picture shoot mode and a photometry control mode available with the illustrative embodiment;

DESCRIPTION OF THE PREFERRED EMBODIMENTS

Figure 1:
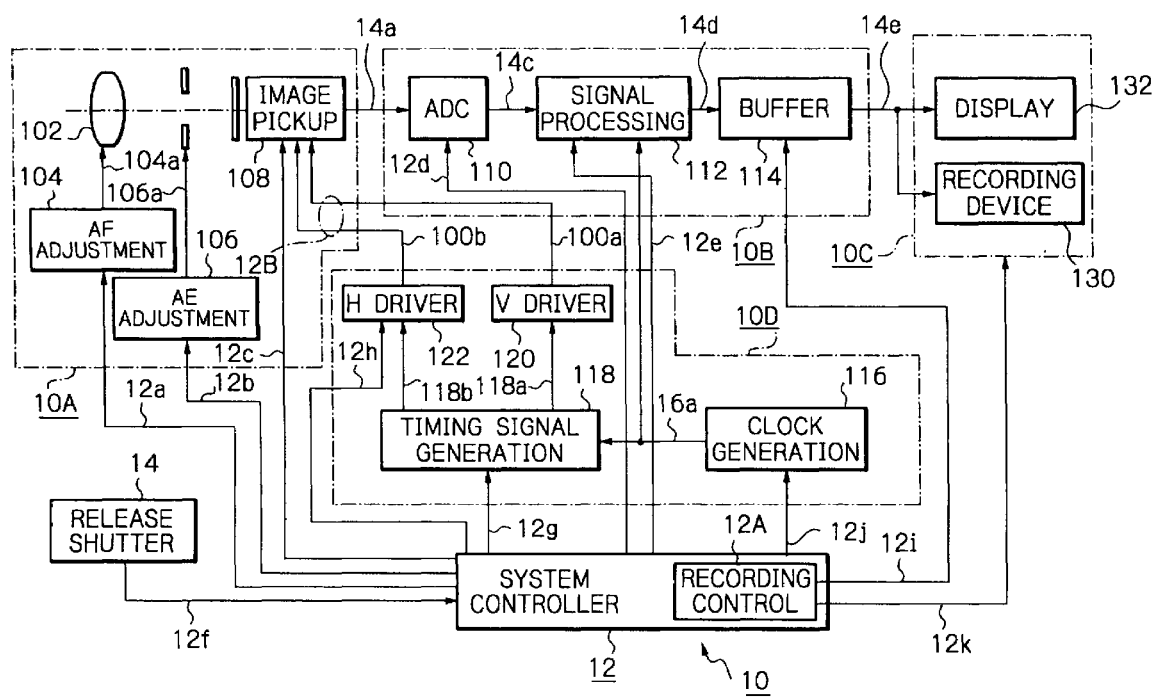
FIG. 1 is a block diagram schematically showing a solid-state image pickup apparatus embodying the present invention.

Briefly, to read image signals at a high speed, the present invention replaces the conventional thinning of lines in the vertical direction with thinning in the horizontal direction. For this purpose, in accordance with the present invention, a color pattern output from a color separating section and horizontal drive signals output from a drive signal generating section are fed to an image pickup section in order to implement a particular pixel read mode different from the conventional all pixel read mode. It is to be noted that structural elements not relevant to the understanding of the present invention are not shown or described, and that reference numerals attached to various signals correspond to reference numerals designating connection lines on which the signals appear.

Referring to FIG. 1 of the drawings, a solid-state image pickup apparatus embodying the present invention is shown and implemented as a digital still camera by way of example. As shown, the digital still camera, generally 10, is generally made up of an image pickup section 10A, a signal processing section 10B, a signal output section 10C, a drive signal generating section 10D, a system controller 12, and a release shutter 14. The image pickup section 10A includes a lens 102, an AF adjustment 104 including a focusing mechanism, not shown, an AE adjustment 106 including a stop mechanism, not shown, and an image pickup 108. If desired, a shutter mechanism, not shown, may be positioned in front of the image pickup 108 in the direction light incidence in order to fully intercept light.

The lens 102 focuses incident light representative of a scene on the photosensitive surface of the image pickup 108. The AF adjustment 104 moves the lens 102 to an optimal position matching with information output from the focusing mechanism and representative of a range between a desired subject and the camera 10. At this instant, the system controller 12 processes the range information and determines the optimal position of the lens 102. More specifically, the system controller 12 feeds a control signal 12a to the AF adjustment 104. In response, the AF adjustment 104 drives its focusing mechanism with a drive signal 104a so as to move the lens 102 to an optimal focal position.

The system controller 12 includes an exposure control circuit, not shown, for calculating the photometric value of the scene including the subject. The AE adjustment 106 adjusts, under the control of the exposure control circuit, an iris diaphragm included in the stop mechanism, thereby restricting an incident beam to an optimal quantity. In the illustrative embodiment, photometry is implemented by part of image signals. The system controller 12 calculates an exposure and feeds a control signal 12b representative of the exposure to the AE adjustment 106. In response, the AE adjustment 106 delivers a drive signal 106a to each of the stop mechanism and shutter mechanism for setting up an optimal exposure indicated by the control signal 12b.

Figure 2:
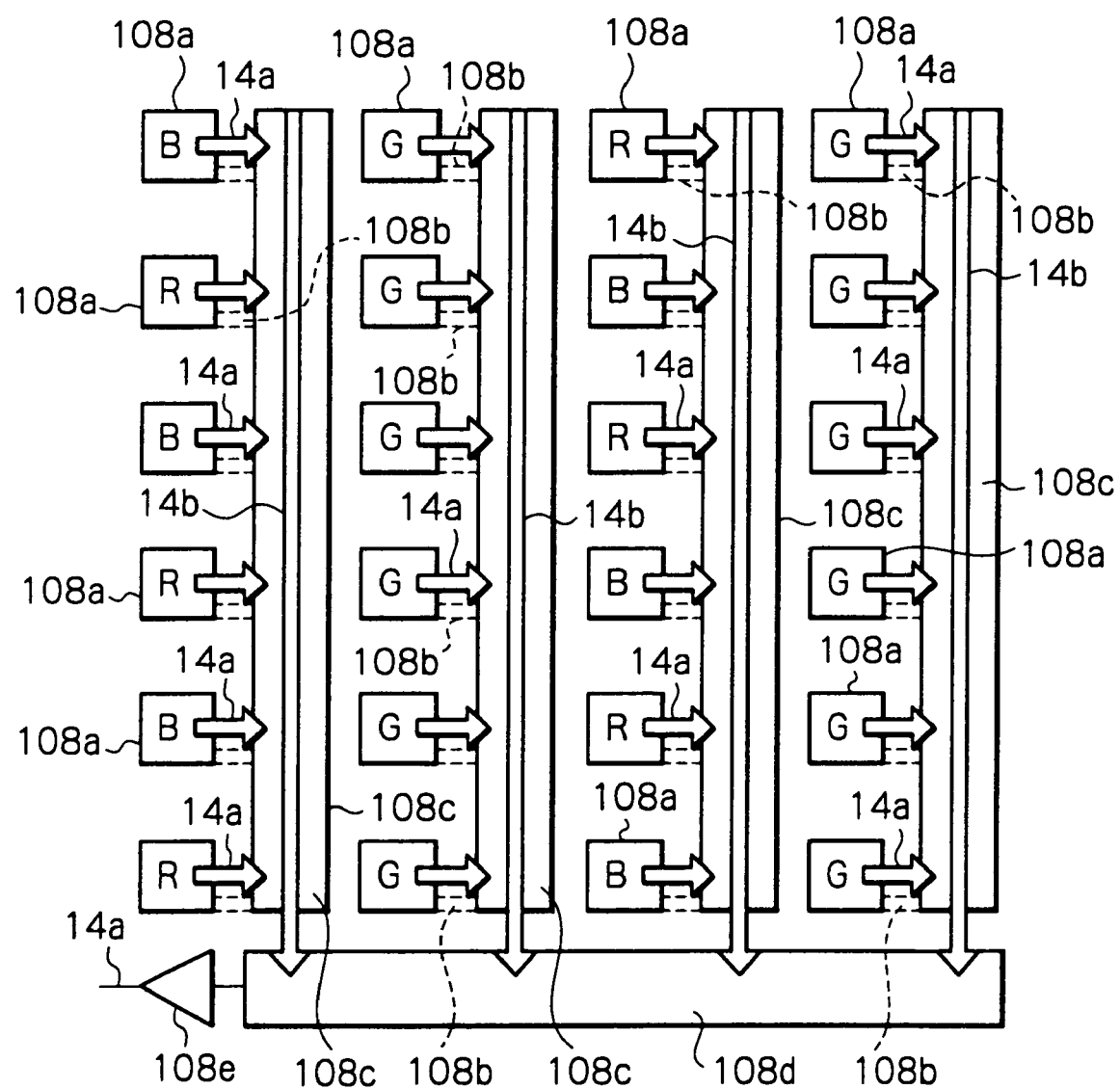
FIG. 2 is a schematic block diagram showing a specific configuration of an image pickup section included in the illustrative embodiment.

FIG. 2 shows a specific configuration of the image pickup 108. As shown, the image pickup 108 has photosensitive cells or photoelectric transducers 108a arranged bidimensionally in rows and columns. The photosensitive cells 108a each transform incident light to a corresponding electric signal or signal charge. Color filters for color separation, not shown, each are positioned in front of a particular photosensitive cell 108a in the direction of light incidence. The color filters are implemented as a single plate and arranged such that, e.g., three primary colors R, G and B separated by the filters are selectively input to the photosensitive cells 108a, as indicated by letters R, G and B in FIG. 2. The arrangement of the colors R, G and B shown in FIG. 2 is generally referred to as a G vertical stripe, RB full checker pattern.

The image pickup 108 receives a control signal 12c from the system controller 12 and receives drive signals 12B from the drive signal generating section 10D which will be described later specifically. The photosensitive cells 108a are implemented by CCDs. As shown in FIG. 2, transfer gates or signal read gates 108b each are connects between one photosensitive cell 108a and a vertical transfer path 108c adjoining the cell 108a, preventing a signal charge 14a stored in the cell 108a from leaking. Specifically, the transfer gates 108b transfer signal charges 14a stored in the associated photosensitive cells 108a to the vertical transfer paths 108c adjoining the cells 108a in response to field shift pulses not shown. The field shift pulses are fed to the transfer gates 108b via electrodes not shown.

The drive signals 12B fed from the drive signal generating section 10D to the image pickup 108, as mentioned earlier, are made up of vertical drive signals 100a and horizontal drive signals 100b which will be described specifically later. Each vertical transfer path 108c sequentially transfers, in accordance with the vertical drive signals 100a, the signal charges 14a read out of the adjoining photosensitive cells 108a via the transfer gates 108b in the direction of columns, i.e., vertically as indicated by arrows 14b in FIG. 2. As shown in FIG. 2, the signal charges 14a transferred vertically downward along the transfer paths 108c are handed over to a horizontal transfer path 108d. The horizontal transfer path 108d transfers the signal charges 14a horizontally to the signal processing section 10B via an amplifier 108e in accordance with the horizontal drive signals 100b.

As shown in FIG. 1, the signal processing section 10B includes an ADC (Analog-to-Digital Converter) 110, a signal processing 112, and a buffer 114. The ADC 110 converts the analog image signals, or signal charges, 14a output from the image pickup 108 to digital image data 14c in accordance with a control signal 12d fed from the system controller 12 and a clock signal, not shown, fed from a clock generation 116 which will be described specifically later. The signal processing 112 executes white balance correction, gamma correction, aperture correction and other conventional correction with the digital data 14c input thereto from the ADC 110. Subsequently, the signal processing 112 processes the corrected digital data in accordance with either one of two different modes selected via the release shutter 14. The two modes are a still picture shoot mode for storing at least a still picture picked up in a recording device 130 included in the signal output section 10C, and a photometry control mode or preshooting mode for simply controlling the AE mechanism and AF mechanism of the image pickup section 10A.

The system controller 12 feeds a control signal 12e representative of the above still picture shoot mode or the photometry control mode currently selected on the camera 10 to the signal processing 112. In the still picture shoot mode, the corrected image data 14d are subjected to compression or similar preselected modulation under the control of the system controller 12. In the photometry control mode, the image signals 14a are read out of the image pickup 108 at a rate, e.g., two times higher than the conventional reading rate under the control of the system controller 12. In addition, the image signals 14a are thinned down in the vertical direction, so that they can be displayed on a display 132 also included in the signal output section 10C. The compression or similar modulation effected by the image processing 112 in the still picture shoot mode transforms the image signals 14a to video signals capable of being written to the recording device 130. The signal processing 112 delivers only the image data 14d to be displayed or recorded to the buffer 114.

The system controller 12 controlling the entire camera 10 receives a signal 12f from the release shutter 14 and determines which of the still picture shoot mode and photometry control mode is selected by the operator. The system controller 12 controls the drive signal generating section 10D on the basis of the result of the above decision. The system controller 12 includes a record control 12A. The record control 12A controls the buffer 114 and the recording device 130 of the signal output section 10C in accordance with a timing signal output from the system controller 12.

The drive signal generating section 10D includes a clock generation 116 and a timing signal generation 118. The system controller 116 feeds a control signal 12j to the clock generation 116 and causes it to generate a synchronizing signal 16a. The synchronizing signal 16a is derived from an original oscillation clock causing the camera 10 to operate with an NTSC (National Television System Committee) system or a PAL (Phase Alternation by Line) system. The synchronizing signal 16a is fed from the clock generation 116 to the signal processing 112 and timing signal generation 118. In addition, the clock generation 116 delivers a particular clock to each of the ADC 110 and buffer 114 as a sampling signal or a write/read enable signal.

The timing signal generation 118 outputs, in accordance with the synchronizing signal 16a, various timing signals including a vertical timing signal 118a and a horizontal timing signal 118b as well timing signals, not shown, for effecting a field shift and a line shift. The vertical timing signal 118a and horizontal timing signal 118b are respectively applied to a V (vertical) driver 120 and an H (horizontal) driver 122 for driving the vertical transfer paths 108c and horizontal transfer path 108d, FIG. 2. The V driver 120 and H driver 122 respectively output the previously mentioned drive signals 100a and 100b in accordance with the timing signals 118a and 118b. Generally, the vertical drive signals 100a output from the V driver 120 are switched in accordance with the mode selected in order to adjust the signal reading rate. The timing signal generation 118 additionally outputs timing signals, not shown, for controlling the AF adjustment 104 and AE adjustment 106.

When the system controller 12 delivers a control signal 12g indicative of the photometry control mode to the timing signal generation 118, the generation 118 causes the substrate voltages, i.e., overflow-drain (OFD) voltages of the photosensitive devices 108a assigned to the colors R and B to rise. This will be described more specifically later. Generally, the signal reading rate is adjusted also by the vertical drive signals 100a output from the V driver 120 in accordance with the mode selected.

Figure 3:
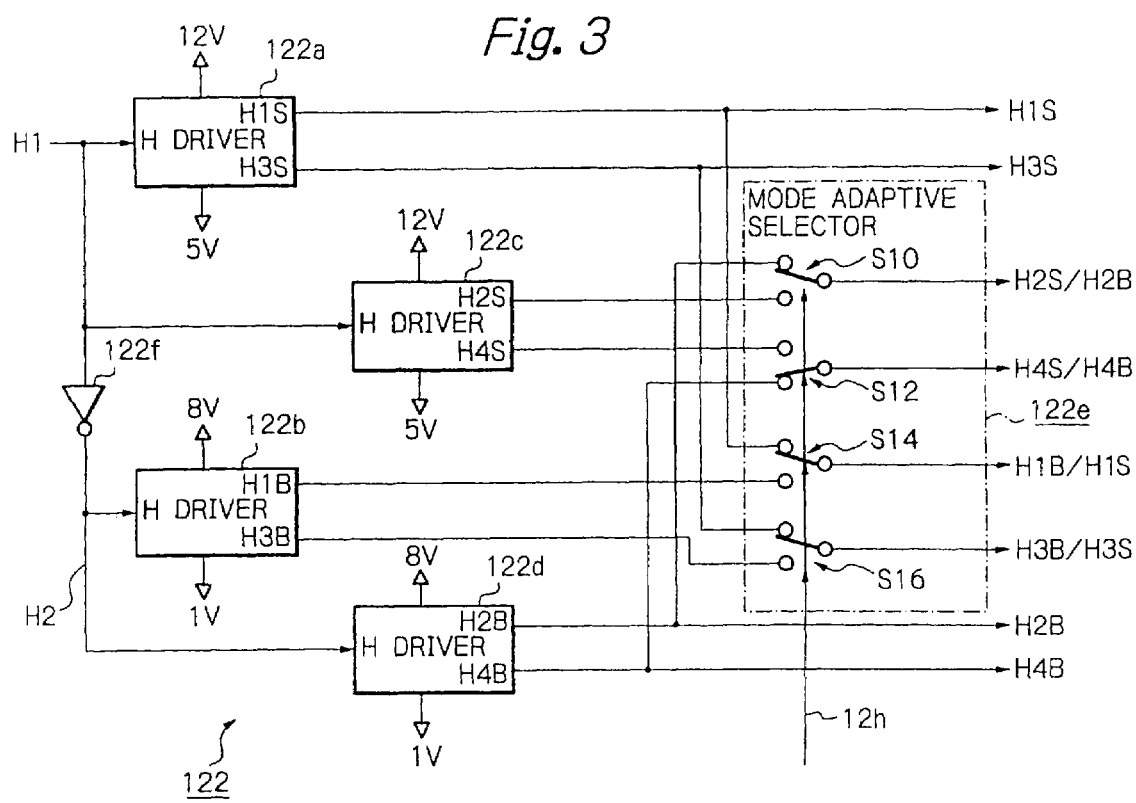
FIG. 3 is a schematic block diagram showing a specific configuration of an H (horizontal) driver also included in the illustrative embodiment.

In the illustrative embodiment, not only the V driver 120 but also the H driver 122 are switched in accordance with the mode selected. FIG. 3 shows a specific configuration of the H driver 122. As shown, the H driver 122 is made up of four H drivers 122a, 122b, 122c and 122d and a mode adaptive selector 122e. Voltages of 12 V and 5 V are applied to the H drivers 122a and 122c, respectively. The outputs of the H drivers 122a and 122c are dependent on the level of a horizontal timing signal H1 input to the H drivers 122a and 122c. The horizontal timing signal H1 corresponds to the horizontal timing signal 118b, FIG. 1; the label H1 is used to adequately show the feature of the signal. Voltages of 8 V and 1 V are applied to the H drivers 122b and 122d, respectively. An inverter 122f inverts the horizontal timing signal H1 to thereby output an inverted horizontal timing signal H2 and feeds the signal H2 to the H drivers 122b and 122d. The outputs of the H drivers 122b and 122d are dependent on the level of the horizontal timing signal H2. It follows that the outputs H1S and H3S of the H driver 122a and the outputs H2S and H4S of the H driver 122c each have an amplitude between 12 V to 5 V, and that the outputs H1B and H3B of the H driver 122b and the outputs H2B and H4B of the H driver 122d each have an amplitude between 8V to 1V.

Figure 4:
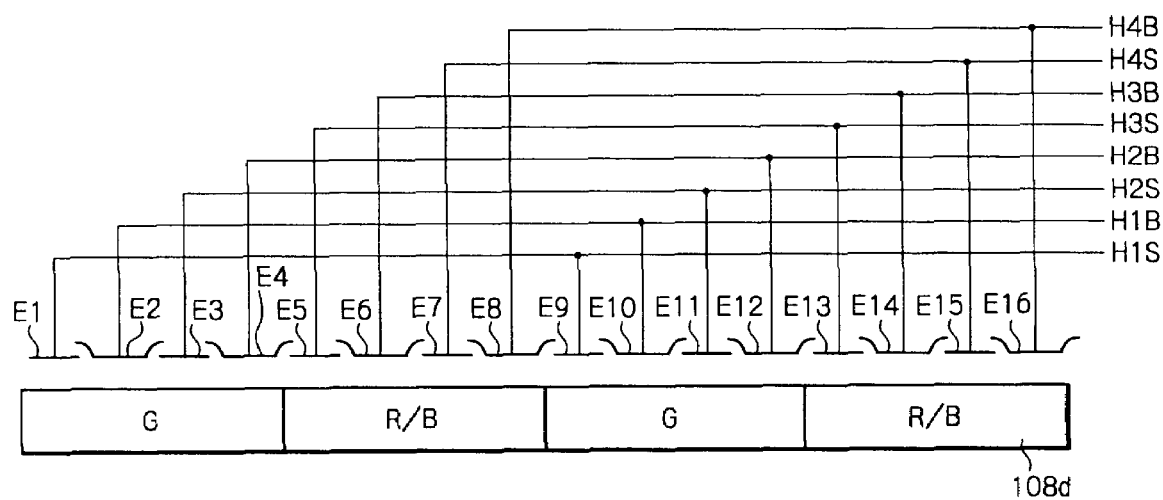
FIG. 4 is a diagram showing a relation between electrodes arranged on a horizontal transfer path included in the image pickup section of FIG. 2 and horizontal drive signals applied thereto.

The system controller 12 feeds a control signal 12h to the H driver 122 in accordance with the mode selected. The H driver 122 causes the mode adaptive selector 122e to output a signal level dependent on the control signal 12h. Specifically, the mode adaptive selector 122e has four switches S10, S12, S14 and S16. The control signal 12h causes the selector 122e to select output signals H2S and H4S of the H driver 122c and the output signals H1B and H3B of the H drivers 122b in the still picture shoot mode or select the output signals H1S and H3S of the H driver 122a and the output signals H2B and H4B of the H driver 122d in the photometry control mode. FIG. 3 shows settings of the switches S10, S12, S14 and S16 matching one of such two conditions, the photometry control modes for reading only the color G. The eight signals H1S–H4S and H1B–H4B each are fed to two of sixteen electrodes E1–E16 shown in FIG. 4. The electrodes E1–D16 each are associated with a particular transfer element of the horizontal transfer path 108d, FIG. 2.

Referring again to FIG. 1, the buffer 114 included in the signal processing section 10B has a function of amplifying the video signal 14d output from the signal processing 112 to a preselected amplitude and a function of adjusting a period of time at the time of recording as well as other functions. The buffer 114 outputs a video signal 14e representative of an image to the signal output section 10C in accordance with a control signal 12i output from the record control 12A of the system controller 12.

The recording device 130 of the signal output section 10C includes a semiconductor memory applicable to, e.g., a memory card, an optical recording medium, a magnetoptical recording medium or similar recording medium not shown. The recording device 130 records the video signal 14e in the recording medium in accordance with a control signal 12k output from the record control 12A. The recording device 130 is capable of reading the video signal 14e out of the recording medium and display it on the display 132, as desired. If the recording medium is removable from the recording device 130, then the medium may be removed and mounted to an apparatus for reproducing a video signal or printing out an image.

The illustrative embodiment allows the operator to press the release shutter 14 stepwise to either one of two positions, i.e., a half-pressed position and a full-pressed position. In the half-pressed position, the release shutter 14 selects the photometry control mode and sends the signal 12f representative of the mode to the system controller 12. In the full-pressed position, the release shutter 14 provides the system controller 12 with an image pickup timing while sending the signal 12f representative of the still picture shoot mode to the system controller 12. Further, if the power supply to the release shutter 14 is set up and if a monitor switch, not shown, mounted on the camera 10 is turned on, the system controller 12 causes the display 132 to operate in a movie mode.

The operation of the digital camera 10 having the above configuration will be described hereinafter. First, the operator intending to shoot a desired scene presses the release shutter 14 to the half-pressed position assigned to the photometry control mode. In this stage of operation, among the color signals R, G and B produced by the image pickup 108, only the color signal G is read out under the control of the system controller 12. This is effected at a high speed in accordance with the drive signals 12B, as will be described specifically later. The resulting image signals 14a output from the image pickup 108 are fed to the signal processing section 10B in accordance with the control signal 12c output from the system controller 12. The signal processing section 10B digitizes the image signals 14a and delivers the resulting image data 14c to the system controller 12 as photometry data via a signal line not shown.

The system controller 12 performs calculation with the above photometry data so as to produce the control signals 12a and 12b for AF adjustment and AE adjustment, respectively. The control signals 12a and 12b are respectively fed to the AF adjustment 104 and AE adjustment 106, as stated earlier. In response, the AF adjustment 104 and AE adjustment 106 each perform particular adjustment by use of the respective mechanism. The AF adjustment and AE adjustment are repeated so long as the photometry control mode is selected.

The operator presses the release shutter 14 deeper to the full-pressed position assigned to the still picture shoot mode at any desired time for shooting the scene. In response, the release shutter 14 feeds the signal 12f for recording the scene to the system controller 12. As a result, the image pickup section 10A picks up light incident from the scene in the same manner as in the photometry control mode. In the still picture shoot mode, however, the image pickup 108 executes processing for outputting all of the three color signals R, G and B. This is, of course, done by drive signals different from the drive signals used in the photometry mode. The resulting image signals 14a are digitized by the ADC 110 and then fed to the signal processing 112 as the digital data 14c. The signal processing 112 processes the digital data 14c in such a manner as to further extend their frequencies to the high frequency side. Subsequently, the signal processing 112 executes compression and other conventional processing with the digital data 14c and delivers the processed data to the signal output section 10C via the buffer 114. In the still picture shoot mode, the signal output section 10C writes the input image data in the recording device 132 in accordance with the control signal 12k output from the record control 12A. The recording device 132 is, of course, capable of reading the recorded image data in accordance with the control signal 12k, as stated previously.

The drive signal generating section 10D is so constructed as to adapt to both of the photometry mode and still picture shoot mode, as stated earlier. Reference will be made to FIGS. 3 and 5A–5I for describing the operation of the H driver 122. As shown in FIG. 3, the horizontal timing signal H1 is applied to the H drivers 122a and 122c while the horizontal timing signal H2 is applied to the H drivers 122b and 122d.

In the still picture shoot mode, the image pickup 108 receives the previously mentioned OFD voltages for determining the signal charge storing capacities of the photosensitive cells 108a, and a transfer gate timing signal, not shown, for effecting the field shift of signal charges from the photosensitive cells 108a to the vertical transfer paths 108c via the transfer gates 108b. Specifically, the signal charges 14a stored in the photosensitive cells 108a are transferred to the associated vertical transfer paths 108c in response to the transfer gate timing signal. The vertical transfer paths 108c sequentially transfer the signal charges 14a toward the horizontal transfer path 108d in synchronism with the vertical drive signals 100a fed from the V driver 120 to their transfer elements. The signal charges 14a reached the ends of the vertical transfer paths 108c are handed over to the horizontal transfer path 108d.

Thereafter, the horizontal timing signal H1 is fed to the horizontal transfer path 108d.

In the still picture shoot mode, the signal charges are sequentially input to the horizontal transfer path 108d in the order of G, R/B, G, R/B, G and so forth by way of example, as shown in FIG. 5A. FIG. 5A shows the R, G and B color pattern 10 at its upper portion and the horizontal drive signal H1 at its lower portion. As shown, the horizontal timing signal H1 having a preselected period is fed to read the signal charges 14a out of the horizontal transfer path 108d by four-phase drive. At the same time, to read out all of the pixels, the H driver 122 combines the horizontal timing signal H1 of FIG. 5A and the inverted horizontal timing signal H2, not shown, and delivers the combined drive signals to the image pickup 108, as shown in FIGS. 5B (drive signal) and 5C (another pattern).

Consequently, the signal charges 14a advance one step in the horizontal direction for one period of the above drive signals.

The photometry control mode for reading out only the color G by use of the G vertical stripe, RB full checker pattern will be described hereinafter. In this mode of operation, the drive signal generating section 10D raises, among OFD voltages fed to the image pickup 108, the OFD voltages for the photosensitive cells 108a assigned to the colors R and B. As a result, all the signal voltages derived from the colors R and B are swept out to the substrates. At the same time, the drive signal generating section 10D feeds an OFD voltage allowing an expected amount of signal charge to be stored to the photosensitive cells 108a assigned to the color G. In addition, at the time of field shift following the shot, the transfer gate timing signal is fed only to the transfer gates 108b associated with the color G. Consequently, only signal charges derived from the color G appear on the vertical transfer paths 108c. These signal charges 14a are transferred to the horizontal transfer path 108d, as stated previously.

In the illustrative embodiment, the above signal charges representative of the color G and existing on the horizontal transfer path 108d may advance two steps at a time for one period of the drive signals, as follows. In the photometry control mode, no signal charges exist in the transfer elements of the horizontal transfer path 108d originally expected to form R/B packets. Such transfer elements are regarded as elements belonging to G regions. Then, the range of each step of the drive signals remaining at a given voltage is doubled. Stated another way, the signals H1S and H2B may, in principle, be considered to represent the same state.

The mode adaptive selector 122e selects, based on the above concept, the signals H1S, H2B, H3S and H4B in place of the signals H1B, H2S, H3B and H4S, respectively, under the control of the control signal 12h. Consequently, the drive signals H1S, H2B, H3S and H4B related to each other as shown in FIGS. 5D–5G are output. At this instant, the drive signals cause the color G selectively obtained, as shown in FIGS. 5H and 5I, to advance two steps corresponding to eight electrodes at a time. That is, the drive signals double the amount of movement by a single drive, compared to the previous all pixel reading. Translating the amount of movement into a period of time, it will be seen that the drive signals have a period only one half of the period of the drive signals fed at the time of all pixel reading. By so transferring the signal charges 14a by two steps at a time, it is possible to thin down the image signals to one half in the horizontal direction. As a result, despite the G vertical stripe, RB full checker pattern, only the signal charges 14a derived from the color G are read out of the image pickup 108 in half an amount, compared to the amount read out in the still picture shoot mode.

If the above horizontal thinning operation is effected at a two times higher speed, the signal charges 14a will be read out at a two times higher speed. This is successful to reduce the horizontal reading period to one-fourth of the horizontal reading period particular to full pixel reading.

By the unique drive scheme described above, image data for photometry control are output at a high speed on the basis of the signal charges 14a derived from the color G. The system controller 12 performs calculation with such image data and then executes AF adjustment and AE adjustment described previously. Considering the ever increasing number of pixels, this kind of scheme is particularly desirable when, e.g., AF adjustment uses only a luminance signal. As for AF adjustment using only a luminance signal, the camera 10 is capable of doubling the conventional photometry control speed.

The above embodiment has concentrated on the G vertical stripe, RB full checker pattern in implementing the rapid read-out of the signal charges 14a in the photometry control mode. Also available for the rapid reading of the signal charges 14a from the horizontal transfer path 108d is a so-called honeycomb type G square lattice, RB full checker or checker pattern. This type of pattern has been proposed to solve a problem that the sensitivity or area of the individual photosensitive cell, for example, decreases due to the increasing number of pixels. Specifically, in the honeycomb type pattern, pixels adjoining each other are shifted from each other by half a pitch in the horizontal and vertical directions.

Figure 6A:
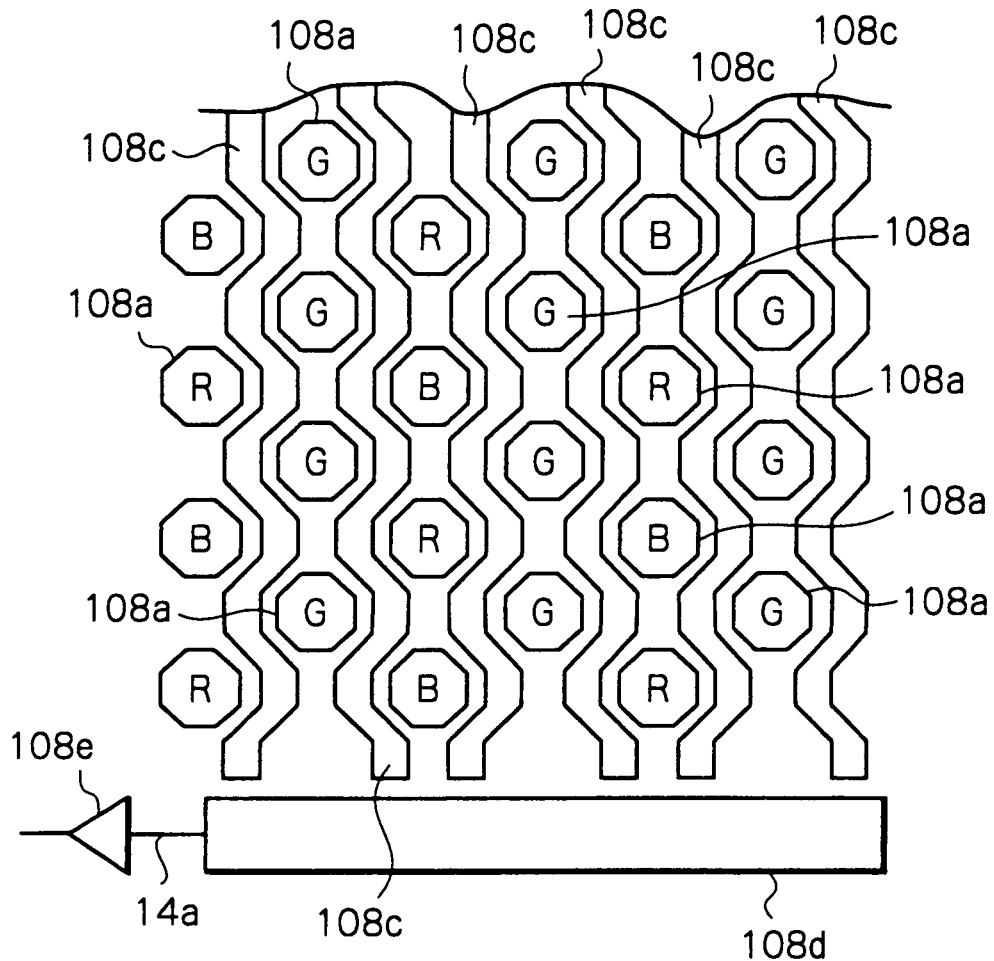
FIG. 6A is a view showing another specific configuration of the image pickup section.
Figure 6B:
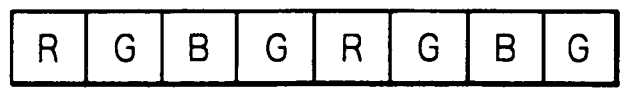
FIG. 6B shows color signals R, G and B read out of the image pickup section of FIG. 6A in a specific sequence.
Figure 6C:
FIG. 6C shows the color signals G read out of the image pickup section of FIG. 6A in the photometry control mode.

The honeycomb type G square lattice, RB full checker pattern is shown in FIG. 6A specifically. As shown, the photosensitive devices or cells 108a assigned to the colors R, G and B each are shifted by half a pitch from adjoining ones with respect to the center. The honeycomb pattern is the combination of a pattern in which the G cells 108a form a square and a full checker pattern in which the R cells 108a and B cells 108a each diagonally face each other. In this pattern, too, the G cells 108a are arranged in vertical arrays or columns not including the R cells 108a or the B cells 108a. By using this relation effectively, it is possible output the R, G and B color signals to the horizontal transfer path 108d in the still picture shoot mode, as shown in FIG. 6B, or output only the G color signals to the path 108d in the photometry control mode, as shown in FIG. 6C. In FIG. 6B, the color signals R, G and B appear on the path 108d in the order of R, G, B, G, R, G, B and so forth. In FIG. 6C, only the color signals G appear every other pixel. When the signals G of FIG. 6C are read out, or horizontally transferred, at a rate double the rate of the horizontal timing signal assigned to the still picture shoot mode, the total reading time is reduced by the intervals between the color signals G.

As stated above, at least in an application in which the photosensitive cells with the color G are arranged in the vertical direction, i.e., in the direction of columns, signal charges of necessary color or colors can be read out in either one of the still picture shoot mode and photometry control mode. That is, the signal charges can be selectively read out even when the number of pixels increases. This insures simple, rapid transfer of signal charges with no consideration given to the order of reading. It follows that processing with data derived from signal charges can be executed more rapidly in the photometry control mode than in the still picture shoot mode. Assuming that a digital still camera effects photometry control within a given period of time, the above reduction of reading time successfully reduces the load to actually act on the individual mechanism. In addition, the camera 10 reading the signal charges in the above manner is practicable even with a Bayer pattern.

The entire disclosure of Japanese patent application No. 315510/1998 filed on Nov. 6, 1998 and including the specification, claims, accompanying drawings and abstract of the disclosure is incorporated herein by reference in its entirety.

While the present invention has been described with reference to the illustrative embodiment, it is not to be restricted by the embodiment. It is to be appreciated that those skilled in the art can change or modify the embodiment without departing from the scope and spirit of the present invention.

What is claimed is:

1. A solid-state image pickup apparatus comprising:
an image pickup section including:
    a color separating section including color filters assigned to three primary colors R (red), G (green) and B (blue) for separating colors of light incident from a desired scene, the color filters assigned to the color G being arranged in vertical stripes;
    a plurality of photosensitive cells arranged bidimensionally in one-to-one correspondence to said color filters each for transforming light output from a particular color filter to a corresponding signal charge;
    a plurality of vertical transfer paths, each one offset from each vertical column of said plurality of photosensitive cells, each comprising transfer elements arranged in a vertical direction for vertically transferring signal charges fed from adjoining ones of said plurality of photosensitive cells;
    a horizontal transfer path perpendicular to said plurality of vertical transfer paths and comprising transfer elements arranged in a horizontal direction for transferring the signal charges fed from said plurality of vertical transfer paths;
    a plurality of signal reading circuits, one for each one of said plurality of photosensitive cells, for shifting the signal charges from said plurality of photosensitive cells to said plurality of vertical transfer paths, offset from said plurality of photosensitive cells; and
    charge sweeping circuitry for sweeping out needless ones of the signal charges stored in said plurality of photosensitive cells;
a mode selecting section for selecting, when an operation for reading the signal charges out of said image pickup section is represented by a mode, either one of an all pixel read mode for reading the signal charges from all of said plurality of photosensitive cells and a particular pixel read mode for reading only the signal charges representative of the color G;

a drive signal generating section for feeding horizontal and vertical drive signals to said image pickup section, and providing said horizontal drive signals with a period shorter in said particular pixel read mode than in said all pixel read mode; and a controller for controlling said drive signal generating section in a particular manner in each of said all pixel read mode and said particular pixel read mode.

2. An apparatus in accordance with claim 1, wherein said color separating section has any one of a G stripe pattern, a G stripe, RB checker pattern, and a G stripe, RB full checker pattern in which the color G is arranged in a square lattice while the colors R and B each are diagonally arranged at opposite sides of the color G.

3. The apparatus in accordance with claim 1, wherein the color filters assigned to the colors R and B being arranged diagonally with respect to the color filters assigned to the color G.

4. The apparatus in accordance with claim 3, wherein each of said plurality of photosensitive cells being shifted in position by half a pitch from adjoining ones of said photosensitive cells.

5. The apparatus in accordance with claim 1, wherein said mode selecting section generating a different phase of the horizontal drive signal selected from a plurality of signal levels in response to a horizontal timing signal fed from said drive signal generating section and a control signal fed from said controller.

6. The apparatus in accordance with claim 1, wherein said drive signal generating section includes a horizontal signal driver, wherein the horizontal signal driver includes:

a first plurality of horizontal line drivers configured to output a first set of horizontal output signals based on a horizontal timing signal; and a second plurality of horizontal line drivers configured to output a second set of horizontal output signals based on an inverted horizontal timing signal, wherein said horizontal signal driver is configured to output said horizontal drive signals based on said first and second set of horizontal output signals.

7. The apparatus in accordance with claim 6, wherein a voltage of each said first set of horizontal output signals is one of a first high voltage and a first low voltage, a voltage of each said second set of horizontal output signals is one of a second high voltage and a second low voltage, and an order of voltages from highest to lowest is first high voltage, second high voltage, first low voltage, and second low voltage.

8. The apparatus in accordance with claim 6, wherein said horizontal signal driver is configured to output said horizontal drive signals based on all of said first and second set of horizontal output signals in all pixel read mode, and a subset of said first set of horizontal output signals and a subset of said second set of horizontal output signals in particular pixel read mode.

9. A signal reading method for a solid-state image pickup apparatus including an image pickup section including a color separating section having color filters assigned to three primary colors R, G and B for separating colors of light incident from a desired scene, plurality of photosensitive cells arranged bidimensionally in one-to-one correspondence to said color filters each for transforming light output from a particular color filter to a corresponding signal charge, and charge sweeping circuitry for sweeping out needless ones of signal charges stored in said plurality of photosensitive cells, said image pickup section transferring the signal charges of said plurality of photosensitive cells in a vertical direction, offset from vertical columns of said plurality of photosensitive cells, and then in a horizontal direction; said signal reading method comprising the steps of:

(a) selecting, when an operation for reading the signal charges out of said image pickup section is represented by a mode, either one of an all pixel read mode for reading the signal charges from all of said plurality of photosensitive cells and a particular pixel read mode for reading only the signal charges representative of the color G;

(b) generating drive signals for driving said image pickup section in accordance with said all pixel read mode or said particular pixel read mode selected thereby generating a different phase of a horizontal drive signal being generated in response to a control signal fed for said all pixel read mode or said particular pixel read mode selected;

(c) storing, in said particular pixel read mode, the signal charges derived from the color G in response to said drive signals while sweeping out the signal charges derived from the colors R and B;

(d) effecting a field shift of only the signal charges stored;

(e) vertically transferring, the signal charges derived from the color G and subjected to the field shift; and (f) horizontally transferring the signal charges vertically transferred at a period shorter than a period of time necessary for the signal charges to be read out in said all pixel read mode.

10. A method in accordance with claim 9, wherein step (b) comprises:

(g) generating first drive signals for storing, in said particular pixel read mode, the signal charges derived from the color G while sweeping out the signal charges derived from the colors R and B;

(h) generating second drive signals for effecting the field shift;

(i) generating third drive signals for vertically transferring the signal charges subjected to the field shift; and (j) generating drive signals for horizontally transferring the signal charges vertically transferred at a period shorter than a period of time necessary for the signal charges to be read out in said all pixel read mode.

11. The method in accordance with claim 10, wherein said step (j) comprises:

(k) generating a first set of horizontal output signals based on a horizontal timing signal;

(l) generating a second set of horizontal output signals based on an inverted horizontal timing signal; and (m) outputting said drive signals for horizontally transferring the signal charges based on said first and second set of horizontal output signals.

12. The method in accordance with claim 11, wherein a voltage of each said first set of horizontal output signals is one of a first high voltage and a first low voltage, a voltage of each said second set of horizontal output signals is one of a second high voltage and a second low voltage, and an order of voltages from highest to lowest is first high voltage, second high voltage, first low voltage, and second low voltage.

13. The method in accordance with claim 11, wherein said step (m) comprises outputting said horizontal drive signals based on
all of said first and second set of horizontal output signals in all pixel read mode, and
a subset of said first set of horizontal output signals and a subset of said second set of horizontal output signals in particular pixel read mode.

14. The method in accordance with claim 9, wherein the color filters are assigned to the color G being arranged in vertical stripes, the color filters assigned to the colors R and B are arranged diagonally with respect to the color filters assigned to the color G, and each of the plurality of photosensitive cells are shifted in position by half a pitch from adjoining ones of the photosensitive cells, wherein in the step (e), the signal charges derived from the color G are vertically transferred in a path offset from said vertical column of said plurality of photosensitive cells.

15. A solid-state image pickup apparatus comprising:
an image pickup section including:
a color separating section including color filters assigned to three primary colors R (red), G (green) and B (blue) for separating colors of light incident from a desired scene, the color filters assigned to the color G being arranged in stripes;
a plurality of photosensitive cells arranged bidimensionally in one-to-one correspondence to said color filters each for transforming light output from a particular color filter to a corresponding signal charge;
a plurality of vertical transfer paths each comprising transfer elements arranged in a vertical direction for vertically transferring signal charges fed from adjoining ones of said plurality of photosensitive cells;
a horizontal transfer path perpendicular to said plurality of vertical transfer paths and comprising transfer elements arranged in a horizontal direction for transferring the signal charges fed from said plurality of vertical transfer paths;
signal reading circuitry for shifting the signal charges from said plurality of photosensitive cells to said plurality of vertical transfer paths; and
charge sweeping circuitry for sweeping out needless ones of the signal charges stored in said plurality of photosensitive cells;
a mode selecting section for selecting, when an operation for reading the signal charges out of said image pickup section is represented by a mode, either one of an all pixel read mode for reading the signal charges from all of said plurality of photosensitive cells and a particular pixel read mode for reading only the signal charges representative of the color G;
a drive signal generating section for feeding horizontal and vertical drive signals to said image pickup section, and providing said horizontal drive signals with a period shorter in said particular pixel read mode than in said all pixel read mode; and
a controller for controlling said drive signal generating section in a particular manner in each of said all pixel read mode and said particular pixel read mode,
said mode selecting section generating a different phase of the horizontal drive signal selected from a plurality of signal levels in response to a horizontal timing signal fed from said drive signal generating section and a control signal fed from said controller;
each of said horizontal drive signals output from said drive signal generating section comprising:
first horizontal drive signals different in phase from each other and used as one unit in said all pixel read mode and equal in number to electrodes to which said drive signals are fed in said all pixel read mode; and
second horizontal drive signals different in phase from each other and used as one unit in said particular pixel read mode and two times greater in number than the electrodes used in said all pixel read mode.

16. An apparatus in accordance with claim 15, wherein said second horizontal drive signals have a period which is substantially equal to one half of a period of said first horizontal drive signals.

17. The solid-state image pickup apparatus of claim 15, wherein each of the plurality of the vertical transfer paths is offset from each vertical column of said plurality of photosensitive cells.

18. The solid-state image pickup apparatus in accordance with claim 15, wherein said drive signal generating section includes a horizontal signal driver, wherein the horizontal signal driver includes:
a first plurality of horizontal line drivers configured to output a first set of horizontal output signals based on a horizontal timing signal; and
a second plurality of horizontal line drivers configured to output a second set of horizontal output signals based on an inverted horizontal timing signal,
wherein said horizontal signal driver is configured to output said horizontal drive signals based on said first and second set of horizontal output signals.

19. The solid-state image pickup apparatus in accordance with claim 18, wherein
a voltage of each said first set of horizontal output signals is one of a first high voltage and a first low voltage,
a voltage of each said second set of horizontal output signals is one of a second high voltage and a second low voltage, and
an order of voltages from highest to lowest is first high voltage, second high voltage, first low voltage, and second low voltage.

20. The solid-state image pickup apparatus in accordance with claim 18, wherein said horizontal signal driver is configured to output said horizontal drive signals based on
all of said first and second set of horizontal output signals in all pixel read mode, and
a subset of said first set of horizontal output signals and a subset of said second set of horizontal output signals in particular pixel read mode.

* * * * *